(12) United States Patent
Herrault et al.

(10) Patent No.: US 9,337,124 B1
(45) Date of Patent: May 10, 2016

(54) METHOD OF INTEGRATION OF WAFER LEVEL HEAT SPREADERS AND BACKSIDE INTERCONNECTS ON MICROELECTRONICS WAFERS

(71) Applicant: HRL LABORATORIES LLC, Malibu, CA (US)

(72) Inventors: Florian G. Herrault, Agoura Hills, CA (US); Alexandros Margomenos, Pasadena, CA (US); Miroslav Micovic, Los Angeles, CA (US); Melanie S. Yajima, Los Angeles, CA (US); Eric M. Prophet, Santa Barbara, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/532,761

(22) Filed: Nov. 4, 2014

(51) Int. Cl.
| | |
|---|---|
| *H01L 21/00* | (2006.01) |
| *H01L 23/373* | (2006.01) |
| *H01L 23/40* | (2006.01) |
| *H01L 21/48* | (2006.01) |
| *H01L 23/00* | (2006.01) |
| *H01L 21/027* | (2006.01) |
| *H01L 21/3213* | (2006.01) |

(Continued)

(52) U.S. Cl.
CPC ........ *H01L 23/3736* (2013.01); *H01L 21/0274* (2013.01); *H01L 21/32051* (2013.01); *H01L 21/32135* (2013.01); *H01L 21/4882* (2013.01); *H01L 21/768* (2013.01); *H01L 21/76841* (2013.01); *H01L 23/3732* (2013.01); *H01L 23/40* (2013.01); *H01L 24/83* (2013.01); *H01L 2224/8385* (2013.01); *H01L 2224/83203* (2013.01); *H01L 2924/01022* (2013.01); *H01L 2924/01028* (2013.01); *H01L 2924/01029* (2013.01); *H01L 2924/01079* (2013.01); *H01L 2924/0665* (2013.01); *H01L 2924/1033* (2013.01); *H01L 2924/10253* (2013.01); *H01L 2924/10272* (2013.01); *H01L 2924/10329* (2013.01); *H01L 2924/10335* (2013.01); *H01L 2924/14* (2013.01); *H01L 2924/2064* (2013.01); *H01L 2924/20101* (2013.01); *H01L 2924/20102* (2013.01); *H01L 2924/20103* (2013.01); *H01L 2924/20105* (2013.01)

(58) Field of Classification Search
CPC ... H01L 23/34; H01L 23/2023; H01L 33/641; H01L 33/644; H01L 21/78
USPC .................. 257/706, 707, 782, 783; 438/122
See application file for complete search history.

(56) References Cited

U.S. PATENT DOCUMENTS

| | | | |
|---|---|---|---|
| 6,018,459 A | * | 1/2000 | Carlson ................ F28F 13/003 165/80.3 |
| 8,375,576 B2 | | 2/2013 | Kwon |
| 8,617,927 B1 | | 12/2013 | Margomenos et al. |

(Continued)

OTHER PUBLICATIONS

U.S. Appl. No. 14/286,923, Margomenos et al., filed May 23, 2014

(Continued)

*Primary Examiner* — S. V. Clark
(74) *Attorney, Agent, or Firm* — Ladas & Parry (57) ABSTRACT

A method for forming a wafer level heat spreader includes providing a mesh wafer, the mesh wafer having a plurality of openings and mesh regions between the openings, bonding the mesh wafer to a backside of an integrated circuit (IC) wafer, the IC wafer comprising a plurality of circuits; and electroplating a heat sink material through the plurality of openings and onto to the backside of the IC wafer.

33 Claims, 8 Drawing Sheets

(51) Int. Cl.
*H01L 21/3205* (2006.01)
*H01L 21/768* (2006.01)

(56) References Cited

U.S. PATENT DOCUMENTS

| | | | |
|---|---|---|---|
| 8,644,020 B2 * | 2/2014 | Lau | H01L 23/427 165/80.5 |
| 2005/0155752 A1 * | 7/2005 | Larson | H01L 23/3733 165/185 |
| 2006/0027635 A1 | 2/2006 | Schaenzer et al. | |
| 2006/0091509 A1 | 5/2006 | Zhao et al. | |
| 2006/0157223 A1 * | 7/2006 | Gelorme | H01L 23/3733 165/80.3 |
| 2006/0292747 A1 | 12/2006 | Loh | |
| 2007/0015666 A1 * | 1/2007 | Hans Thieme | H01L 39/143 505/431 |
| 2007/0075420 A1 | 4/2007 | Lu et al. | |
| 2007/0247851 A1 | 10/2007 | Villard | |
| 2008/0099770 A1 | 5/2008 | Mendendorp et al. | |
| 2008/0128897 A1 | 6/2008 | Chao | |
| 2008/0298021 A1 | 12/2008 | Ali et al. | |
| 2009/0108437 A1 | 4/2009 | Raymond | |
| 2009/0134421 A1 | 5/2009 | Negley | |
| 2009/0294941 A1 | 12/2009 | Oh et al. | |
| 2015/0007965 A1 * | 1/2015 | Joshi | F28F 13/185 165/104.28 |

OTHER PUBLICATIONS

K-C Chen et al., "Thermal Management and Novel Package Design of High Power Light-Emitting Diodes", Electronic Components and Technology Conference, May 2008, pp. 795-797.

Feeler et al., "Next-Generation Microchannel Coolers", Northrop Grumman, Proceedings of SPIE 2008, pp. 687608-1-687608-8.

A. Margomenos et al., "Novel Packaging, Cooling and Interconnection Method for GaN High Performance Power Amplifiers and GaN Based RF Front-Ends", European Microwave Conference 2012, pp. 615-618.

A. Margomenos et al., "X-Band High Efficient GaN Power Amplifier Utilizing Built-In Electroformed Heat Sinks for Advanced Thermal Management", IEEE International Microwave Symposium, Jun. 2-7, 2013, pp. 1-4.

* cited by examiner

METHOD OF INTEGRATION OF WAFER LEVEL HEAT SPREADERS AND BACKSIDE INTERCONNECTS ON MICROELECTRONICS WAFERS

CROSS REFERENCE TO RELATED APPLICATIONS

None

TECHNICAL FIELD

This disclosure relates to wafer-scale integration of heat spreaders and backside interconnects onto microelectronic wafers.

BACKGROUND

Heat extraction is a major bottleneck for microelectronic chips. Advances in silicon micromachining, micro-molding, and material science, such as compound heat sinks with matched coefficient of temperature expansion (CTE), Thermal Interface Materials (TIM), such as thermoplastic, and material growth, such as chemical vapor deposition (CVD) grown carbon nano-tubes and thin film diamond, over the last decade have significantly increased the efficiency and heat extraction ability of micro-cooling systems. However, these technologies are not adequate for wide band gap semiconductors (GaN and SiC) which are generating heat fluxes in excess of 1 kW/cm$^2$ and do not simultaneously address packaging, interconnection and cooling at the wafer-scale.

K-C Chen et al in "Thermal management and novel package design of high power light emitting diodes", National Cheng Kung University, Taiwan, Electronic Components and Technology Conference, 2008, which is incorporated herein by reference, describe a heat extraction technique; however, the authors do not address the interconnection issue between chips.

A. A. Ali et al in a "Notebook computer with hybrid diamond heat spreader", Apple Inc, US Patent Application: US 2008/0298021 A1, filed May 31, 2007, which is incorporated herein by reference, describe the use of CVD deposited thin film diamond for a heat spreader. The chip is mounted on thin film diamond using a TIM material (solder, thermal grease, phase change epoxy, or thin film metal: Ti/Pt/Au layer).

R. Feeler et al in "Next-generation microchannel coolers", Northrop Grumman, Proceedings of SPIE 2008, which is incorporated herein by reference, describe a micro-channel cooler for LED arrays using Low Temperature Co-Fired Ceramic (LTCC) material. They describe using a heat sink made out of AlN, BeO or CVD diamond under the LED chip and then connecting this to the LTCC micro-channel. The CTE of LTCC is close to GaAs and InP so they describe using hard solder, which may be AuSn, to mount the LED on the cooler. The LTTC addresses one major failure mechanism of copper micro-channels, which is their erosion when they are exposed to high water speeds. However, this approach has some disadvantages which include a greater than 300 micron distance between the backside of the chip and the cooling water, which is not optimal, and the fact that LTCC has only a thermal conductivity of 3.5 W/mK compared to the present disclosure which uses aluminum and copper with thermal conductivities of 150 W/mK, and 400 W/mK, respectively. As a result of the low thermal conductivity of LTCC, R. Feeler et al need to use an additional thin film diamond or AlN heat sink under a light emitting diode (LED) chip, and the LED chip mounting requires solder which adds a high thermal resistance layer. R. Feeler et al do not address chip interconnection, which is extremely critical for high frequency applications.

J. Oh et al in "Package-on-package system with heat spreader", US Published Patent Application 2009/0294941A1, filed May 30, 2008, which is incorporated herein by reference, describe a package-on-package system that includes mounting the chip on a base substrate, positioning an interposer over the chip and forming a heat spreader around the chip and the interposer. Their approach focuses on multi-stacked chips and extracting heat from inside the stack by inserting the heat spreader between the packages as well as at the top of the module. The heat spreader surrounds the entire chip. However this approach has disadvantages. First, it does not offer direct connection to the bottom of the chip, which is the primary area of heat dissipation coming from the active device junction. Instead, heat is removed from the edges of the chip where solder is used to connect the heat sink to the chip, which is a very inefficient way to remove heat and which is definitely inadequate to handle wide band-gap components with high power dissipation. Furthermore, the fact that the heat sink surrounds each chip makes integration of multiple chips difficult since significant component area around each chip is lost. Interconnection between different chips is impossible unless they are combined in a single heat sink, which requires a redesign of the heat sink for each different set of chips.

M. J. Schaenzer et al in "Thermally coupling an integrated heat spreader to a heat sink" US Published Patent Application 2006/0027635 A1, filed Aug. 9, 2004, which is incorporated herein by reference, describe a mounting method where the base of the heat sink is selectively plated with solder and connected to a heat spreader plated with Au. The heat sink is connected to the top of the chip. This approach is close to conventional cooling methods. The disadvantages of this approach are that it requires a high thermal resistance TIM material (solder) to transfer heat from the chip to the heat sink, it can be used for a single chip only and is not applicable to 3D multi-layer systems or multiple chips integrated in a single system, and it offers no solution for interconnecting multiple chips especially for high frequency applications.

More traditional cooling approaches that rely on mounting LED chips on various heat sinks are described in US Published Patent Application US 2009/0134421, filed May 28, 2009, incorporated herein by reference, which describes solid metal block semiconductor light emitting device mounting substrates and packages, US Published Patent Application US 2008/0099770, filed May 1, 2008, incorporated herein by reference, which describes integrated heat spreaders for light emitting devices and related assemblies, US Published Patent Application US 2007/0247851, filed Oct. 25, 2007, incorporated herein by reference, which describes a light emitting diode lighting package with improved heat sink, and US Published Patent Application US 2006/0292747, filed Dec. 28, 2006, incorporated herein by reference, which describes a surface mount power light emitter with integral heat sink.

B. D. Raymond in "Wafer scale integrated thermal heat spreader", US Published Patent Application US 2009/0108437, filed Oct. 29, 2007, which is incorporated herein by reference, describes a method of creating a heat sink by backside metallization of a wafer. This metallization is realized with composite electroplating of various metallic compounds with variable CTE. Some examples are Cu-Diamond, Cr-Diamond, or metallic compounds with Be, BeO and carbon nano-tubes. After the wafer is backside metalized, the individual chips are diced. The disadvantages of this approach are that it metalizes the entire wafer and it does not offer any methods for structural packaging and interconnecting the chips.

S. Z. Zhao et al in "Flip chip package including a non-planar heat spreader and method of making the same" US Published Patent Application US 2006/0091509, filed Nov. 3, 2004, which is incorporated herein by reference, describe a traditional cooling approach focusing on flip-chip interconnected packages. The main novel concept is the formation of a cavity on the heat sink which allows for easier integration of the chip. The disadvantages of this approach are that it requires special machining of the heat sink and it still needs TIM materials for connecting the chip to the heat sink.

US Published Patent Application US 2008/0128897, filed Jun. 5, 2008, which is incorporated herein by reference, describes a heat spreader for a multi-chip package. Similar to Zhao et al, this approach is a more conventional approach focusing on flip-chip mounted chips, and has disadvantages similar to the Zhao approach.

US Published Patent Application US 2007/0075420, filed Apr. 5, 2007, which is incorporated herein by reference, describes a microelectronic package having direct contact heat spreader and method of manufacturing same. This approach is similar to that described by B. D. Raymond above. The main difference is that the devices are flip-chip mounted active face down to a board and then metalized from the back. Again metallic compounds are proposed for better CTE matching. Compared to the B. D Raymond approach, this approach does offer the advantage of processing known-good-die but it requires flip-chip bonding on a board. This is a reliability concern since the solder bumps and the underfil material used have a high thermal resistance.

Cooling packaging and interconnection method for wide band gap devices are described in U.S. Pat. No. 8,617,927, issued Dec. 31, 2013, U.S. patent application Ser. No. 14/286, 923 filed May 23, 2014, A. Margomenos, et al, in "Novel Packaging, Cooling and Interconnection Method for GaN High Performance Power Amplifiers and GaN based RF Front-Ends" European Microwave Conference 2012, and A. Margomenos, et al, "X-Band Highly Efficient GaN Power Amplifier Utilizing Built-In Electroformed Heat Sinks for Advanced Thermal Management", IEEE International Microwave Symposium 2013, which are incorporated herein by reference. The described approaches rely on selected known good dies for wafer-scale packaging; however, there is no focus on wafer-scale integration.

Hyeog Chan Kwon in U.S. Pat. No. 8,375,576, issued Feb. 19, 2013, which is incorporated herein by reference, describes a method for manufacturing a wafer scale heat slug system including dicing an integrated circuit from a semiconductor wafer, forming a heat slug blank equivalent in size to the semiconductor wafer, dicing the heat slug blank to produce a heat slug equivalent in size to the integrated circuit, attaching the integrated circuit to a substrate, attaching the heat slug to the integrated circuit, and encapsulating the integrated circuit. The disadvantage of this approach is its serial and die-level nature.

What is needed is a low-cost and manufacturable wafer-level integration and processing technology that addresses thermal management limitations in high-power-density active devices such as GaN devices and GaN RF MMIC circuits. The embodiments of the present disclosure address these and other needs.

SUMMARY

In a first embodiment disclosed herein, a method for forming a wafer level heat spreader comprises providing a mesh wafer, the mesh wafer having a plurality of openings and mesh regions between the openings, bonding the mesh wafer to a backside of an integrated circuit (IC) wafer, the IC wafer comprising a plurality of circuits, and electroplating a heat sink material through the plurality of openings and onto to the backside of the IC wafer.

In another embodiment disclosed herein, a wafer level heat spreader comprises an integrated circuit (IC) wafer, the IC wafer comprising a plurality of circuits, a mesh wafer bonded to a backside of the IC wafer, the mesh wafer having a plurality of openings and mesh regions between the openings, and heat sink material in the plurality of openings of the mesh wafer and on the backside of the IC wafer.

In yet another embodiment disclosed herein, a method for forming a wafer level heat spreader on a backside of an integrated circuit with backside interconnects comprises providing a mesh wafer, the mesh wafer having a plurality of openings and mesh regions between the openings, forming a passivation layer on a first side of the mesh wafer, aligning the mesh wafer with an IC wafer, the IC wafer comprising a plurality of circuits and backside interconnects on a backside of the IC wafer, the alignment such that mesh regions between the openings of the mesh wafer are aligned to dicing streets between each circuit of the plurality of circuits, bonding the first side of the mesh wafer to the backside of the integrated circuit (IC) wafer using a nonconductive bonding material, depositing a metal layer on a second side of the mesh wafer, and electroplating a heat sink material through the plurality of openings and onto to the backside of the IC wafer, wherein the backside interconnects are insulated from the mesh wafer by the passivation layer, and wherein the metal layer provides a continuous electrical path for electroplating.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Thermal management is critical for performance and reliability of microelectronic circuits, sub-systems, and systems. High-power-density circuits, such as novel wide-bandgap GaN and SiC devices can generate heat fluxes in excess of 1 kW/cm$^2$. As a result, integrated wafer-scale cooling and thermal management technologies are critical. Although chip-scale cooling and packaging technologies are currently the preferred integration method by picking known good dies and packaging them, there is no adequate solution that addresses the challenges associated with wafer-scale integration.

Figure 1:
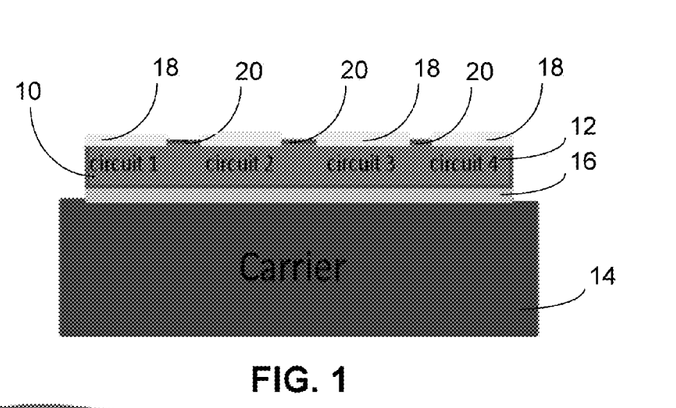
FIG. 1 shows a schematic showing a GaN-on-SiC wafer after backside thinning and backside gold electroplating with the wafer mounted on a carrier prior to thinning using a medium-temperature wax in accordance with the prior art.

A wide band-gap wafer 10 is typically mounted with wax 16 onto a carrier 14 for backside processing which includes wafer thinning/polishing, via etching, and backside metallization 18, which may for example be electroplated gold to form a ground plane, as shown in FIG. 1. On the front-side, the circuit chips 12 are defined through microelectronic processing techniques. The IC wafer 10 may be Si, SiC, GaAs, GaN, InP, Sapphire, Quartz or any other suitable microelectronic substrate material. The carrier substrate 14 may be a Si wafer, glass wafer, or an appropriate carrier board, such as a printed circuit board, Teflon™, FR4, duroid, liquid crustal polymer, and so on. The circuit chips 12 may be GaN, SiGe BiCMOS, Si CMOS, InP or any other integrated circuit technology. Dicing streets 20 are between each circuit chip 12. In the prior art, the IC wafer 10 in FIG. 1 is diced along the dicing streets 20 so that the circuit chips 12 are separated, and then chip-scale cooling and packaging technologies are applied to the circuit chips 12.

Figure 2:
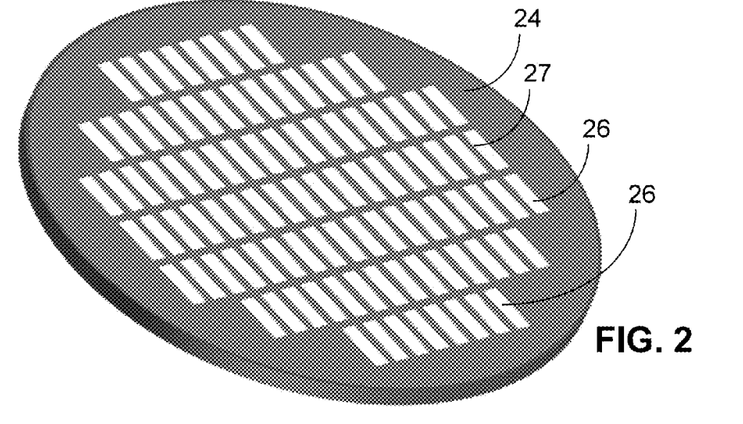
FIG. 2 shows a schematic of a micro-fabricated mesh wafer, with openings or cavities etched through the wafer, and with the mesh pattern consistent with a dicing street design used on an integrated circuit (IC) wafer in accordance with the present disclosure.

FIG. 2 shows a mesh wafer 24 in accordance with the present disclosure. The mesh wafer 24 has openings 26, which may also be called cavities, etched through the mesh wafer 24. The mesh wafer 24 may be a polymer material such as photodefinable SU-8, silicon carbide (SiC), silicon, insulated metal, or quartz. The openings 26 in the mesh wafer 24 are placed so that the mesh pattern is consistent with dicing streets 20 for an integrated circuit (IC) wafer. The result is that the the mesh wafer material 27 between the openings 26 aligns with dicing streets 20 on an IC wafer with which the mesh wafer 24 is used as further explained below.

Figure 3A:
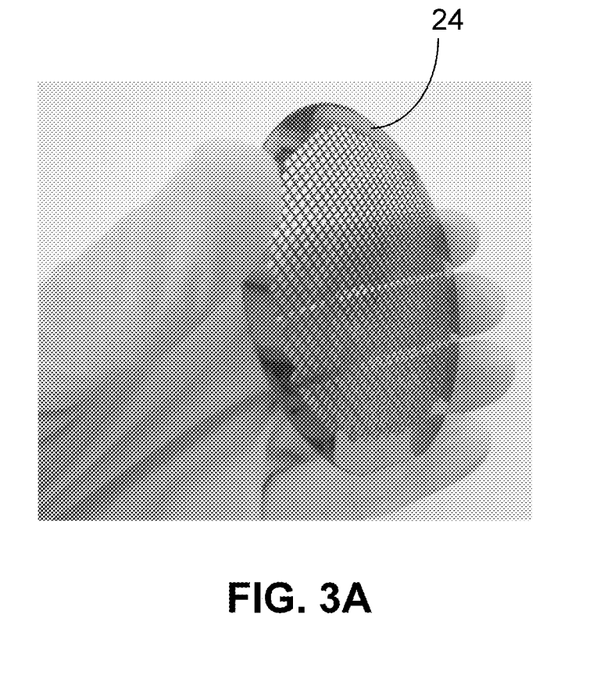
FIG. 3A shows a 3 inch silicon mesh wafer fabricated using laser micromachining with the cavities 1 mm wide and 2 mm long and the silicon mesh wafer 400 micron thick.
Figure 3B:
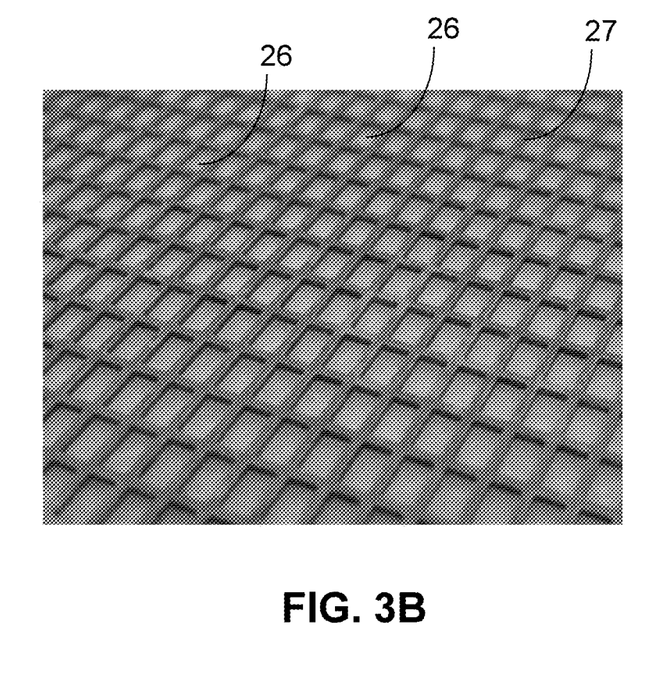
FIG. 3B shows a close-up image of the mesh pattern in accordance with the present disclosure.

For a silicon mesh wafer 24, the fabrication process consists of etching through-wafer cavities by means of plasma dry etching techniques, chemical wet etching techniques, or laser micromachining techniques. An example of a fabricated 3 inch silicon mesh wafer 24 is shown in FIG. 3A. The openings 26 or cavities 26 in the mesh wafer of FIG. 3A are shown in more detail in FIG. 3B. The openings 26 are 2 mm×1 mm. The width of the mesh 27 between the openings 26 is 400 microns and the thickness of the silicon mesh wafer 24 is 300 microns.

There are number of methods for bonding a mesh wafer 24 to the backside of an IC wafer 10.

Figure 4A:
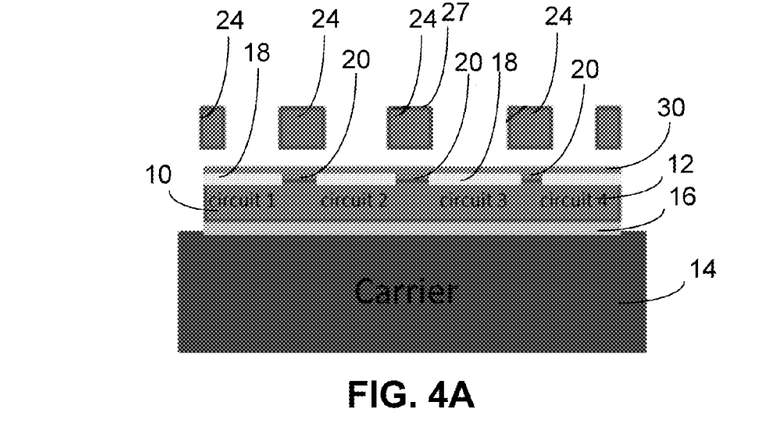
FIG. 4A shows a mesh wafer positioned on top of an IC wafer coated with positive-tone photoresist.

In one method, a photodefinable polymer mesh pattern is directly coated on the backside of an IC wafer 10 and processed following standard photoresist procedures. While still on a carrier 14, as shown in FIG. 4A, the backside of the IC wafer 10 is spin-coated with a positive-tone photoresist 30. The photoresist, which may be Shipley1827, AZ4620, SPR2.20, or another suitable photo resist, may be coated on the backside the IC wafer 10 by spinning, lamination, spraying or any other appropriate method of deposition. The named photoresist materials are only examples and equivalent materials with similar properties known to experts in the field can be utilized in their place. After coating with photoresist 30, the mesh wafer 24 is aligned and placed onto the photoresist 30 coated on the IC wafer 10 using manual or automated alignment, depending on the required resolution, as shown in FIG. 4A. The mesh wafer 24 is aligned with the IC wafer 10, so that the mesh 27, as shown in FIGS. 2 and 4A, of the mesh wafer 24 is aligned with the dicing streets 20 on the IC wafer 24.

The photoresist 30 is then soft-baked at a temperature below 100 degrees centigrade (C) for several minutes. During softbaking, a pressure ranging from 1 to 15 lbs is applied between the mesh wafer 24 and the IC wafer 10 to ensure high bonding strength. After baking, the photoresist is allowed to cool down for several minutes. Then the photoresist 30 is exposed to ultra-violet (UV) light. The mesh wafer 24 acts as a UV mask during exposure. After the exposed photoresist 30 develops, the regions of the photoresist 30 exposed to UV by the openings 26 in the mesh wafer 24 are removed, as shown in FIG. 4C, by techniques well known in the art. Regions of the photoresist 30, such as the photoresist 30 on the dicing streets 20 remain.

It should be noted that non-photodefinable adhesives, such as benzocyclobutene (BCB), SU-8, epoxy, and wax, and negative-tone photoresists such as NR and BCB are also compatible with this approach.

When an adhesive is used, the mesh wafer 24 and the IC wafer 10 are first bonded using the adhesive. Then using the mesh wafer 24 as a mask, the adhesive layer may be etched, so that the adhesive layer exposed by the openings 26 in the mesh wafer is removed. Regions of the adhesive layer, such as the adhesive layer on the dicing streets 20 masked by the mesh wafer 24 remain. The etching may use dry etching techniques such as reactive ion plasma etching. This process is compatible with a transparent mesh wafer 24, such as a quartz or SiC mesh wafer, which cannot act as a UV mask. The result is shown in FIG. 4C, except that the photoresist 30 is instead an adhesive 30.

When a negative tone photoresist is used, the negative tone photoresist is first deposited on the backside of the IC wafer 10. Then using a secondary mask, the regions of the negative tone photoresist corresponding to the openings 26 in the mesh wafer 24 are masked. The exposed negative tone photoresist is then exposed to UV light. Then once developed the regions of the negative tone photoresist corresponding to the openings 26 in the mesh wafer 24 are removed using techniques well known in the art. Dry etching techniques such as reactive ion plasma etching may be used. Then, the mesh wafer 24 is aligned and put on the IC wafer 10. Then the negative tone photoresist is soft-baked at a temperature below 100 degrees centigrade (C) for several minutes. During softbaking, a pressure ranging from 1 to 15 lbs is applied between the mesh wafer 24 and the IC wafer 10 to ensure high bonding strength. The result is shown in FIG. 4C, except that the photoresist 30 is instead a negative tone photoresist 30.

Figure 5A:
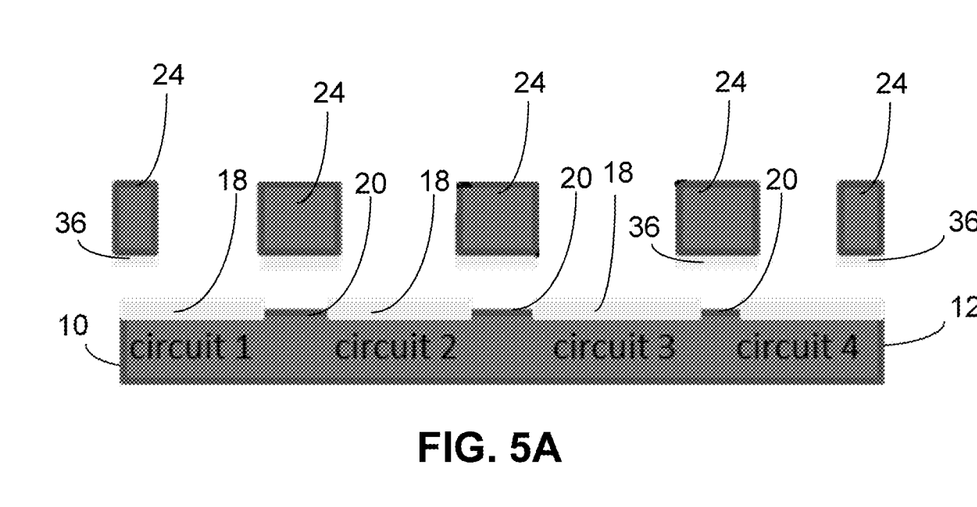
FIG. 5A shows a schematic of a high-temperature bonding process for the mesh wafer and the IC wafer.
Figure 5B:
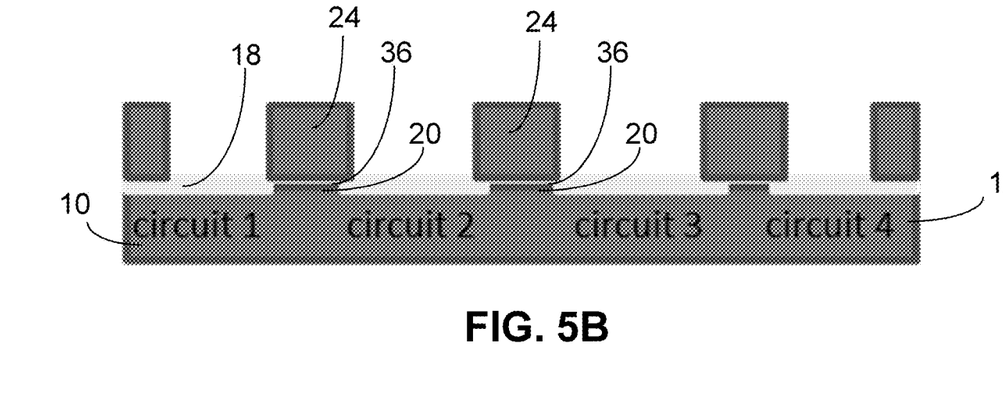
FIG. 5B shows the bonded wafers.

FIGS. 5A and 5B show another method for bonding the mesh wafer 24 to the IC wafer 10. This high-temperature mesh wafer bonding process relies on gold-to-gold thermocompression bonding performed at temperatures ranging from 150 C to 250 C and pressures ranging from 2000 to 10000 newton (N) using a wafer bonder. Materials known to those skilled in the art other than gold may also be used.

Figure 5C:
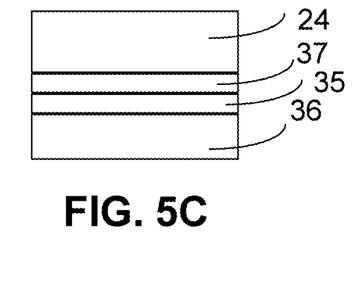
FIG. 5C shows a coated mesh wafer in accordance with the present disclosure.

In contrast to the low-temperature bonding approaches described above, the IC wafer 10 is now released from its carrier 14, as shown in FIG. 5A, by dissolving away the wax layer 16. For a gold to gold bond the mesh wafer 24 is coated with a gold layer 36, and at least some of the dicing streets 20 are coated with gold. The gold layer 36 on the mesh wafer 24 may be deposited and patterned before or after the fabrication of the through-wafer cavities 26. A thin seed metallic layer 35 that is compatible with the subsequently deposited bonding metal may first be deposited on the mesh wafer 24, and also an optional adhesion/barrier layer 37, such as Ti, TiN, Ta, TaN, Cr, Ni, and so on, may be deposited and be in direct contact with the mesh wafer, as shown in FIG. 5C. The thin seed metallic layer 35 and the optional adhesion/barrier layer 37 may be deposited by sputtering, electroless plating, atomic Layer deposition or CVD deposition, and may be Ni, Cu, Ag, Au or other thin film layer. The total thickness of the seed layer 35 is on the order of a 0.5 micron. The gold layer 36 may be 2-3 microns thick and may be deposited through evaporation or electroplating. Then the mesh wafer 24 is bonded to the IC wafer 10 using gold-to-gold thermo-compression bonding performed at temperatures ranging from 150 C to 250 C and pressures ranging from 2000 to 10000 newton (N) using a wafer bonder.

Figure 6A:
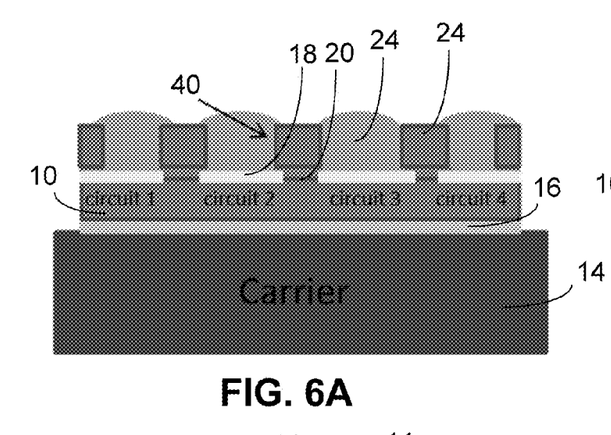
FIG. 6A shows deposition of a heat sink material through electroplating.

Once the mesh wafer 24 has been bonded to the IC wafer 10, then heat sink material 40 is electroplated through the openings 26 in the mesh wafer 24, as shown in FIG. 6A. Using standard electroplating or electroless plating techniques, a high-thermal-conductivity, low-resistance, low-stress heat sink material 40, which may be copper, a copper alloy, silver, a composite metallic material, such as Cu-diamond, Cu-CNT, and so on, or aluminum and other suitable metals is electrodeposited through the openings 26 of the mesh wafer 24 and onto the backside of the IC wafer 10, such as on backside metal 18. The thickness of the heat sink material 40 is directly correlated to the thickness of the mesh wafer 24, and may be a thickness greater than a thickness of the mesh wafer 24. The mesh wafer 24 thickness can range from 0.05 to 1 mm.

Figure 6B:
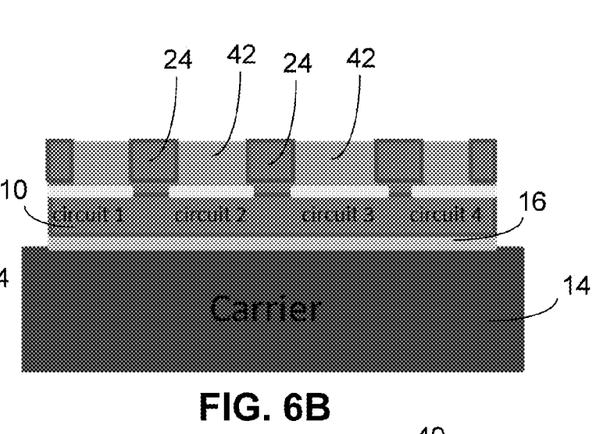
FIG. 6B shows polishing of the heat sink material using the mesh wafer as a polishing stopper, followed by a 1-2 micron-deep heat sink material etch.

Then as shown in FIG. 6B, any over-plated heat sink material may then be polished off using diamond slurry, while the mesh wafer 24 acts as a polishing stopper. The result is polished heat sink material 42 with the heat sink material even with the top surface of the mesh wafer 24.

Figure 6C:
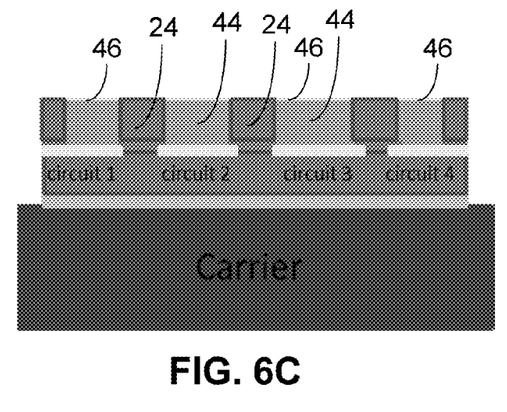
FIG. 6C shows electroplating of a Ni—Au plug up to the mesh wafer surface.

After polishing, the heat sink material 42 is partially etched away chemically to a depth below the surface of the mesh wafer 24 on the order of 1 to 2 microns. The result is remaining heat sink material 44, as shown in FIG. 6C. Then a bi-layer 46 of Ni 47 and Au 49, as shown in FIG. 6E, or other appropriate barrier and metallization layers is subsequently electroplated on the heat sink material 44 to a height up to the surface of the mesh wafer 24, as shown in FIG. 6C.

Figures 6D, 6E:
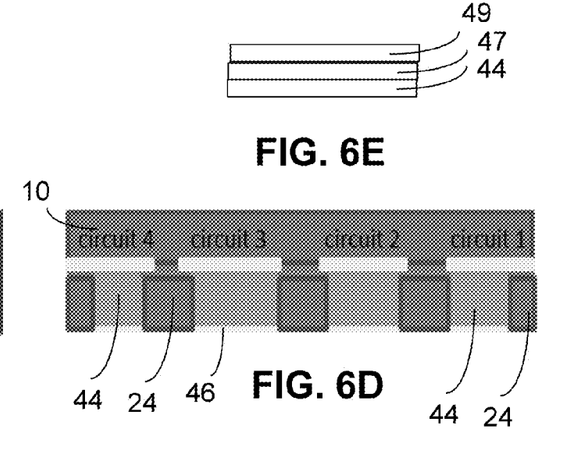
FIG. 6D shows an IC wafer on an integrated heat spreader with the carrier removed.
FIG. 6E shows a bilayer in accordance with the present disclosure.

Finally, the IC wafer 10 is released from the carrier 14, as shown in FIG. 6D, for testing and dicing.

Figure 7A:
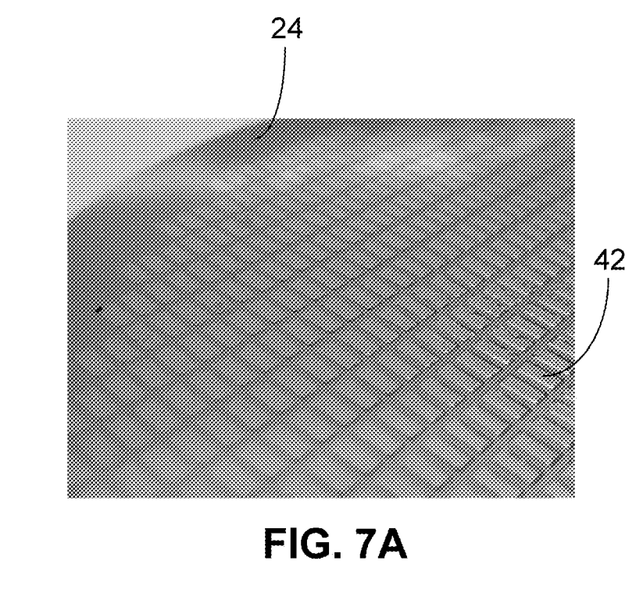
FIG. 7A shows a photograph of wafer-level heat spreader electroplated through a silicon mesh wafer with the silicon mesh wafer gold-to-gold bonded onto a thin silicon dummy wafer.
Figure 7B:
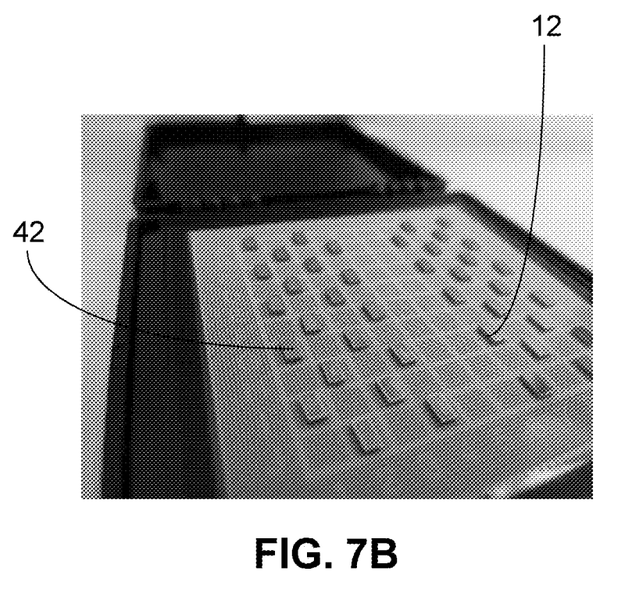
FIG. 7B shows an example of diced wafer scale integrated samples in a gel-pack in accordance with the present disclosure.

FIG. 7A shows a photograph of wafer-level heat spreader 42 electroplated through a silicon mesh wafer with the silicon mesh wafer 24 gold-to-gold bonded onto a thin silicon dummy wafer to show the feasibility of the method described with respect to FIGS. 5A and 5B. The electroplated heat spreader 42 has been polished to provide an ultra-flat wafer backside. FIG. 7B shows an example of diced wafer scale integrated samples in a gel-pack. The die on the left of FIG. 7B show the heat spreaders 42, while the die on the right of FIG. 7B show the front side circuits 12 of the die.

Figure 4B:
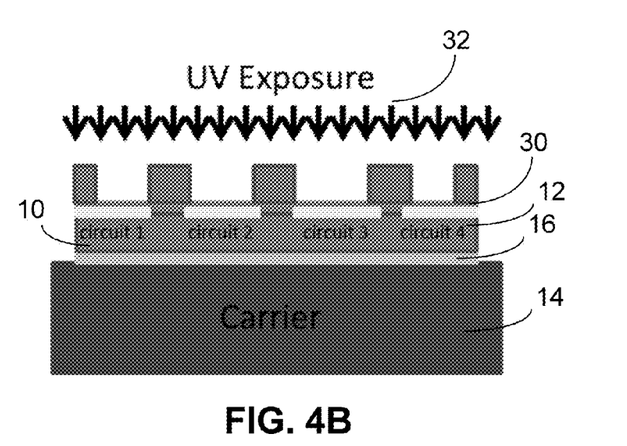
FIG. 4B shows a view after wafer photoresist bonding and UV exposure step with the mesh wafer acting as a UV mask.
Figure 4C:
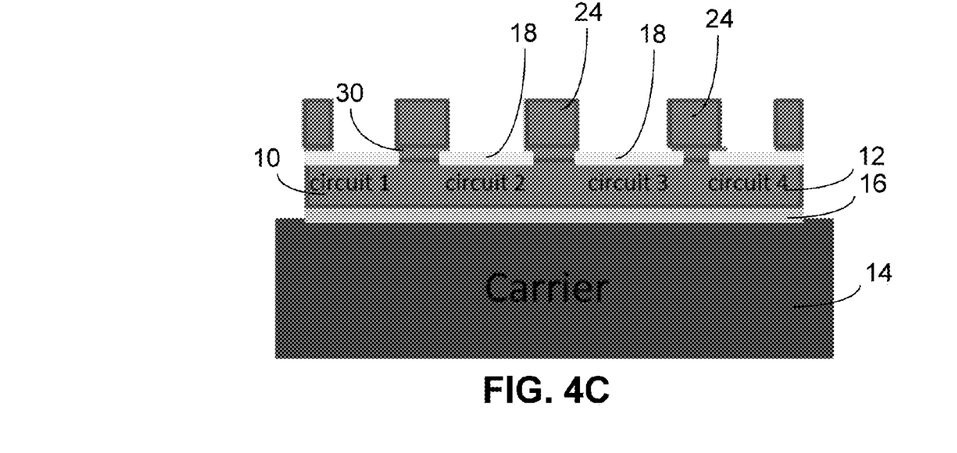
FIG. 4C shows the developed photoresist under open cavities of the mesh wafer removed in accordance with the present disclosure.
Figure 8:
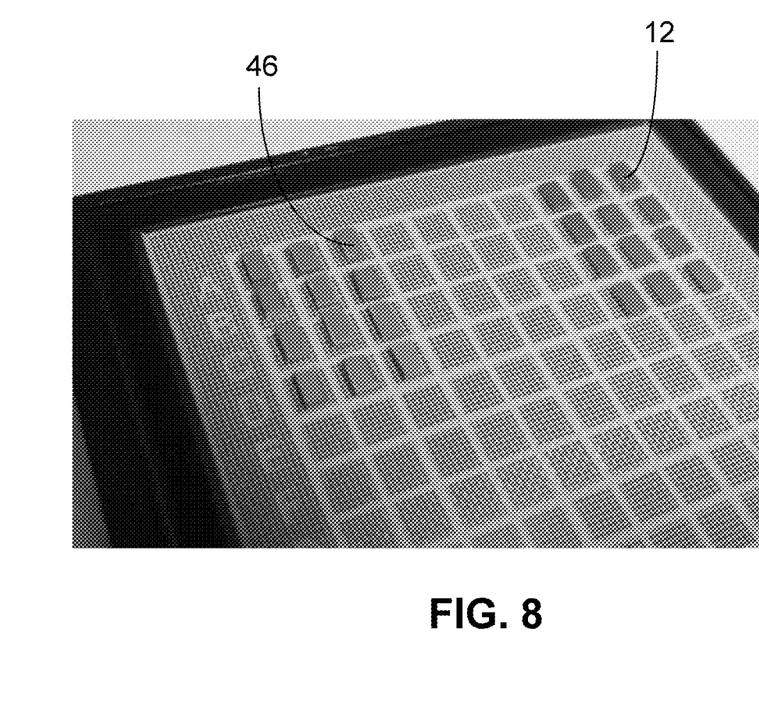
FIG. 8 shows a photograph of diced test samples in a gel-pack, in which the mesh wafer was bonded using a low-temperature wafer bonding approach.

FIG. 8 shows a photograph of diced test samples in a gel-pack, in which the mesh wafer was bonded using low-temperature wafer bonding to show the feasibility of the methods described with respect to FIGS. 4A, 4B and 4C. The die on the left of FIG. 8 show the heat spreader 46, while the die on the right of FIG. 8 show the front side circuits 12 of the die.

FIGS. 9A, 9B, 9C, 9D, 9E and 9F show a method of combining heat spreaders and backside interconnects. The backside interconnects have signals and are other than just ground. The fabrication process shown in FIGS. 9A, 9B, 9C, 9D, 9E and 9F has some similarities with the process presented above, however, three key differences make it possible to co-fabricate electrically-isolated backside interconnects and heat spreaders. For illustration purposes, a close-up view of one circuit is shown; however, the technology is a wafer-level approach, as described above.

Figure 9A:
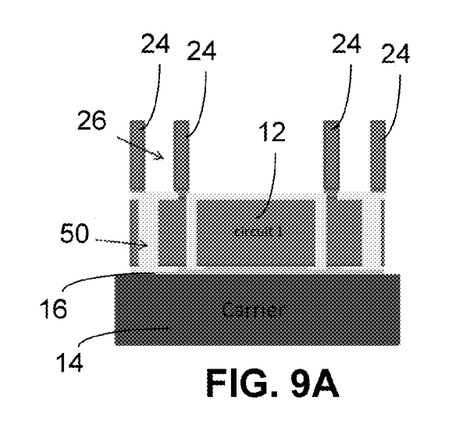
FIGS. 9A, 9B, 9C, 9D, 9E and 9F show a fabrication process flow for integrating a backside heat spreader on a wafer with backside interconnects showing a close-up view of one circuit in accordance with the present disclosure.

The mesh wafer 24 is fabricated using high-resistivity, low RF loss silicon material or other wafers known to be compatible with application-specific requirements by those skilled in the art, and as described above. A first key difference is that the mesh wafer 24 must be passivated to provide electrical isolation and insulation between backside interconnects 50 and the heat spreader material 44. The passivation may be an oxide 25 on the mesh wafer 24, or another coating 25 such as an atomic layer deposition of $Al_2O_2$, a plasma-enhanced chemical vapor deposition (PECVD) of $SiO_2$ or SiN, a parylene coating, or other suitable coatings. After dielectric passivation, the mesh wafer 24 is bonded onto the IC wafer 10 using a non-conductive bonding material, such as the ones described above with reference to FIGS. 4A, 4B and 4C, as shown in FIG. 9A.

Figure 9B:
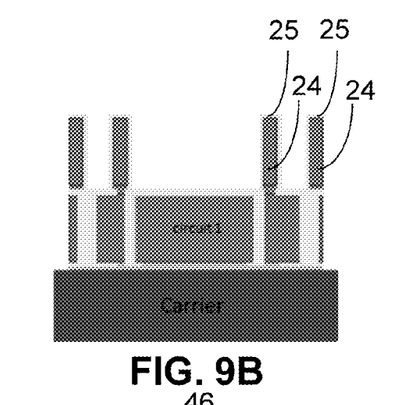

A second key difference is that because the through-IC interconnects 50 are electrically isolated, a Ti/Au membrane or other metallurgic stack 25 known by those skilled in the art is sputter-deposited on the backside of the mesh wafer 24 to provide a continuous electrical path for electroplating, as shown in FIG. 9B.

Figure 9C:
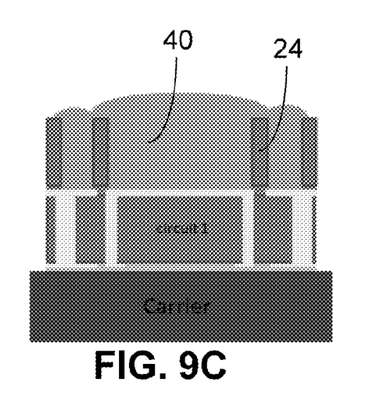
Figure 9D:
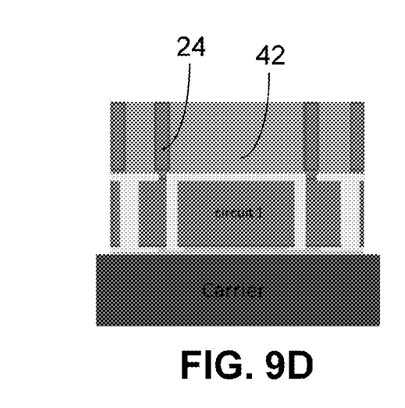

A damascene electroplating of high-thermal conductivity and low-resistance metal 40, which may be Cu, Cu alloys, Cu-CNT, Cu-diamond and other, is performed as shown in FIG. 9C. Then polishing/lapping is performed to remove the over-plated metallic material, but also to polish off the Ti/Au membrane 25 that remains on top of the Si mesh wafer, as shown in FIG. 9D, which is the third key difference. The result is polished heat sink material 42. The Ti/Au membrane 25 may also be etched chemically.

Figure 9E:
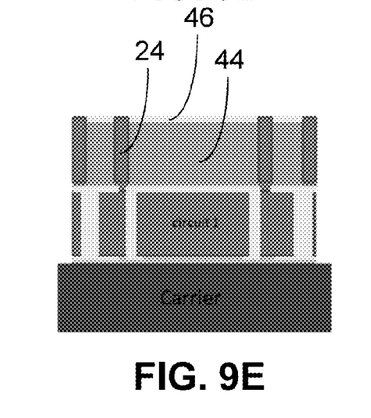

FIG. 9E shows the fabrication of the capping layer 46, which consists of electroplated Ni/Au, as shown in FIG. 6E, patterns on top of the interconnects 50 and heat spreader regions 44. The Ni/Au membrane is sputtered on, followed by standard through-mold Au electroplating. After resist removal, the Au and Ni membrane layers may be etched away via techniques such as ion mill or wet chemical etching.

Figure 9F:
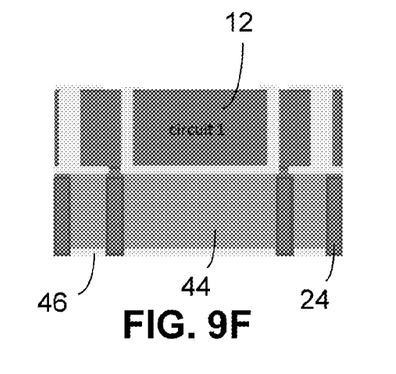

Finally, the IC wafer 10 with integrated heat spreaders 44 and backside interconnects 50 is released from the carrier wafer, as shown in FIG. 9F.

The methods described herein may be used with every chip technology and type of substrate. On-wafer electrical testing is enabled, which provides more accurate device measurements and on-wafer automated DC/RF testing. The present disclosure provides a low-cost and manufacturable wafer-level integration and process technology that addresses thermal management limitations in high-power-density active devices such as GaN devices and GaN RF MMIC circuits.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method for forming a wafer level heat spreader comprising:
    providing a mesh wafer, the mesh wafer having a plurality of openings and mesh regions between the openings;
    bonding the mesh wafer to a backside of an integrated circuit (IC) wafer, the IC wafer comprising a plurality of circuits; and
    electroplating a heat sink material through the plurality of openings and onto to the backside of the IC wafer;
    wherein each mesh region of the mesh wafer consists of a same material.

2. The method of claim 1 further comprising:
    aligning the mesh wafer with the IC wafer before bonding, so that mesh regions between the openings of the mesh wafer are aligned to dicing streets between each circuit of the plurality of circuits.

3. The method of claim 1 wherein:
    the mesh wafer comprises a polymer material such as photodefinable SU-8, silicon carbide (SiC), silicon, insulated metal, or quartz.

4. The method of claim 1 wherein:
    the IC wafer comprises Si, SiC, GaAs, GaN, InP, sapphire, quartz or any other suitable microelectronic substrate material.

5. The method of claim 1 wherein bonding the mesh wafer to a backside of the IC wafer comprises:
    coating the backside of the IC wafer with a positive-tone photoresist;
    aligning the mesh wafer with the IC wafer, so that mesh regions between the openings of the mesh wafer are aligned to dicing streets between each circuit of the plurality of circuits;
    pressing the aligned mesh wafer onto the IC wafer with a pressure ranging from 1 to 15 pounds;
    soft baking the photoresist at a temperature below 100 degrees centigrade (C) for a first time period;
    cooling down the photoresist for a second time period;
    exposing the photoresist not masked by the mesh wafer to ultra-violet (UV) light; and
    removing the exposed photoresist after the exposed photoresist is developed.

6. The method of claim 5 further comprising:
    temporarily bonding a front side of the IC wafer to a carrier before coating the backside of the IC wafer;
    wherein the carrier comprises a Si wafer, a glass wafer, or an appropriate carrier board.

7. The method of claim 1 wherein bonding the mesh wafer to a backside of the IC wafer comprises:
    aligning the mesh wafer with the IC wafer, so that mesh regions between the openings of the mesh wafer are aligned to dicing streets between each circuit of the plurality of circuits;
    bonding the mesh wafer to the IC wafer using an adhesive; and
    etching to remove adhesive exposed by the openings in the mesh wafer;
    wherein the adhesive comprises benzocyclobutene (BCB), SU-8, or epoxy; and
    wherein the etching comprises wet etching, dry etching, or reactive ion plasma etching.

8. The method of claim 1 wherein bonding the mesh wafer to a backside of the IC wafer comprises:
    coating the backside of the IC wafer with a negative tone photoresist;
    masking regions of the negative tone photoresist corresponding to the openings in the mesh wafer;
    exposing the negative tone photoresist to UV light;
    removing the regions of the negative tone photoresist corresponding to the openings in the mesh wafer once developed;
    aligning the mesh wafer with the IC wafer, so that mesh regions between the openings of the mesh wafer are aligned to dicing streets between each circuit of the plurality of circuits;
    pressing the aligned mesh wafer onto the IC wafer with a pressure ranging from 1 to 15 pounds; and
    soft baking the photoresist at a temperature below 100 degrees centigrade (C).

9. The method of claim 1 wherein bonding the mesh wafer to a backside of the IC wafer comprises:
coating at least one or more dicing streets between each circuit of the plurality of circuits with gold;
depositing gold on at least one side of the mesh wafer;
aligning the mesh wafer with the IC wafer, so that mesh regions between the openings of the mesh wafer are aligned to the dicing streets between each circuit of the plurality of circuits;
bonding the mesh wafer to the IC wafer by gold-to-gold thermo-compression bonding;
wherein the thermo-compression bonding is performed at temperatures ranging from 150 C to 250 C and pressures ranging from 2000 to 10000 newton (N).

10. The method of claim 9 wherein depositing gold on at least one side of the mesh wafer comprises:
depositing a seed metallic layer on the mesh wafer before depositing the gold;
wherein the seed metallic layer comprises Ni, Cu, Ag, Au or other thin film layer; and
wherein depositing the seed metallic layer comprises sputtering, electroless plating, atomic Layer deposition or chemical vapor deposition (CVD).

11. The method of claim 10 further comprising:
depositing an adhesion/barrier layer directly on the mesh wafer before depositing the seed metallic layer;
wherein the adhesion/barrier layer comprises Ti, TiN, Ta, TaN, Cr, or Ni; and
wherein depositing the adhesion/barrier layer comprises sputtering, electroless plating, atomic Layer deposition or chemical vapor deposition (CVD).

12. The method of claim 1 wherein electroplating the heat sink material through the plurality of openings and onto to the backside of the IC wafer comprises:
using electroplating or electroless plating; and
wherein the heat sink material comprises copper, a copper alloy, silver, a composite metallic material, such as Cu-diamond, or Cu-CNT, or aluminum.

13. The method of claim 1 wherein a thickness of the heat sink material is greater than a thickness of the mesh wafer.

14. The method of claim 13 wherein electroplating the heat sink material through the plurality of openings and onto to the backside of the IC wafer further comprises:
polishing the heat sink material so that the polished heat sink material is even with a top surface of the mesh wafer;
etching the polished heat sink material to a depth ranging from 1 to 2 microns below the top surface of the mesh wafer; and
depositing a bi-layer on the etched heat sink material, wherein the bi-layer comprises a barrier layer and a metallization layer, and wherein the bi-layer has a height up to the top surface of the mesh wafer.

15. The method of claim 14 wherein the bilayer comprises a barrier layer of Ni, and a metallization layer of Au.

16. A wafer level heat spreader comprising:
an integrated circuit (IC) wafer, the IC wafer comprising a plurality of circuits;
a mesh wafer bonded to a backside of the IC wafer, the mesh wafer having a plurality of openings and mesh regions between the openings; and
heat sink material in the plurality of openings of the mesh wafer and on the backside of the IC wafer;
wherein each mesh region of the mesh wafer consists of a same material.

17. The wafer level heat spreader of claim 16 wherein:
the mesh wafer is aligned with the IC wafer, so that mesh regions between the openings of the mesh wafer are aligned to dicing streets between each circuit of the plurality of circuits.

18. The wafer level heat spreader of claim 16 wherein:
the mesh wafer comprises a polymer material such as photodefinable SU-8, silicon carbide (SiC), silicon, insulated metal, or quartz.

19. The wafer level heat spreader of claim 16 wherein:
the IC wafer comprises Si, SiC, GaAs, GaN, InP, sapphire, quartz or any other suitable microelectronic substrate material.

20. The wafer level heat spreader of claim 16 wherein the heat sink material comprises copper, a copper alloy, silver, a composite metallic material, such as Cu-diamond, or Cu-CNT, or aluminum.

21. The wafer level heat spreader of claim 16 wherein the heat sink material has a depth ranging from 1 to 2 microns below the top surface of the mesh wafer.

22. The wafer level heat spreader of claim 21 further comprising a bi-layer on etched heat sink material, wherein the bi-layer comprises a barrier layer and a metallization layer, and wherein the bi-layer has a height up to the top surface of the mesh wafer.

23. The wafer level heat spreader of claim 22 wherein the bilayer comprises:
a barrier layer of Ni; and
a metallization layer of Au.

24. A method for forming a wafer level heat spreader on a backside of an integrated circuit with backside interconnects comprising:
providing a mesh wafer, the mesh wafer having a plurality of openings and mesh regions between the openings;
forming a passivation layer on a first side of the mesh wafer;
aligning the mesh wafer with an IC wafer, the IC wafer comprising a plurality of circuits and backside interconnects on a backside of the IC wafer, the alignment such that mesh regions between the openings of the mesh wafer are aligned to dicing streets between each circuit of the plurality of circuits;
bonding the first side of the mesh wafer to the backside of the integrated circuit (IC) wafer using a nonconductive bonding material;
depositing a metal layer on a second side of the mesh wafer; and
electroplating a heat sink material through the plurality of openings and onto to the backside of the IC wafer;
wherein the backside interconnects are insulated from the mesh wafer by the passivation layer; and
wherein the metal layer provides a continuous electrical path for electroplating.

25. The method of claim 24 wherein the passivation layer comprises an oxide, an atomic layer deposition of $Al_2O_3$, a plasma-enhanced chemical vapor deposition (PECVD) of $SiO_2$ or SiN, or a parylene coating.

26. The method of claim 24 wherein the metal layer comprises a metal stack of Ti and Au.

27. The method of claim 24 wherein:
the mesh wafer comprises a polymer material such as photodefinable SU-8, silicon carbide (SiC), silicon, insulated metal, or quartz.

28. The method of claim 24 wherein:
the IC wafer comprises Si, SiC, GaAs, GaN, InP, sapphire, quartz or any other suitable microelectronic substrate material.

29. The method of claim 24 wherein bonding the mesh wafer to a backside of the IC wafer comprises:
- coating the backside of the IC wafer with a positive-tone photoresist;
- pressing the aligned mesh wafer onto the IC wafer with a pressure ranging from 1 to 15 pounds;
- soft baking the photoresist at a temperature below 100 degrees centigrade (C) for a first time period;
- cooling down the photoresist for a second time period;
- exposing the photoresist not masked by the mesh wafer to ultra-violet (UV) light; and
- removing the exposed photoresist after the exposed photoresist is developed.

30. The method of claim 24 wherein bonding the mesh wafer to a backside of the IC wafer comprises:
- bonding the mesh wafer to the IC wafer using an adhesive; and
- etching to remove adhesive exposed by the openings in the mesh wafer;
- wherein the adhesive comprises benzocyclobutene (BCB), SU-8, or epoxy; and
- wherein the etching comprises wet etching, dry etching, or reactive ion plasma etching.

31. The method of claim 24 wherein bonding the mesh wafer to a backside of the IC wafer comprises:
- coating the backside of the IC wafer with a negative tone photoresist;
- masking regions of the negative tone photoresist corresponding to the openings in the mesh wafer;
- exposing the negative tone photoresist to UV light;
- removing the regions of the negative tone photoresist corresponding to the openings in the mesh wafer once developed;
- pressing the aligned mesh wafer onto the IC wafer with a pressure ranging from 1 to 15 pounds; and
- soft baking the photoresist at a temperature below 100 degrees centigrade (C).

32. The method of claim 24:
- wherein a thickness of the heat sink material is greater than a thickness of the mesh wafer; and
- wherein electroplating the heat sink material through the plurality of openings and onto to the backside of the IC wafer further comprises:
  - polishing the heat sink material so that the polished heat sink material is even with a top surface of the mesh wafer, and to remove the metal layer on the mesh wafer;
  - etching the polished heat sink material to a depth ranging from 1 to 2 microns below the top surface of the mesh wafer; and
  - depositing a bi-layer on the etched heat sink material, wherein the bi-layer comprises a barrier layer and a metallization layer, and wherein the bi-layer has a height up to the top surface of the mesh wafer.

33. The method of claim 32 wherein the bilayer comprises a barrier layer of Ni, and a metallization layer of Au.

* * * * *